United States Patent
Bolam et al.

(10) Patent No.: US 6,879,177 B1
(45) Date of Patent: Apr. 12, 2005

(54) METHOD AND TESTING CIRCUIT FOR TRACKING TRANSISTOR STRESS DEGRADATION

(75) Inventors: Ronald Jay Bolam, East Fairfield, VT (US); William Paul Hovis, Rochester, MN (US); Terrance Wayne Kueper, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/731,072

(22) Filed: Dec. 9, 2003

(51) Int. Cl.[7] .............................................. G01R 31/26
(52) U.S. Cl. ...................................... 324/765; 324/769
(58) Field of Search ............................. 324/158.1, 764, 324/765, 763, 769, 768, 549; 438/141, 153, 154

(56) References Cited

U.S. PATENT DOCUMENTS 4,970,497 A * 11/1990 Broadwater et al. ........ 340/598
6,806,117 B2 * 10/2004 King ............................ 438/60
2003/0042926 A1    3/2003 Rost

* cited by examiner

*Primary Examiner*—David Zarneke
*Assistant Examiner*—Trung Q. Nguyen
(74) *Attorney, Agent, or Firm*—Joan Pennington

(57) ABSTRACT

A method and testing circuit are provided for tracking transistor stress degradation. A first array of P-channel field effect transistors (PFETs) is connected in parallel. The first array of PFETs is stressed by applying a low gate input and a high source and a high drain to the PFETs during a stress period. The first array of PFETs is tested by operating the PFETs in a saturated region during a test period. A reference array of PFETs is not stressed during the stress period. The reference array of PFETs is activated for testing to compare a saturated drain current performance with the first array of PFETs during the test period.

18 Claims, 4 Drawing Sheets

100

METHOD AND TESTING CIRCUIT FOR TRACKING TRANSISTOR STRESS DEGRADATION

FIELD OF THE INVENTION

The present invention relates generally to the integrated circuit field, and more particularly, relates to a method a nd testing circuit for tracking transistor stress degradation.

DESCRIPTION OF THE RELATED ART

Negative bias temperature instability (NBTI) is becoming an industry pervasive problem that causes P-channel field-effect transistor (PFET) performance degradation primarily manifested as an increase in the absolute value of threshold voltage of the transistor. The degradation occurs as a result of normal use and builds up where the device is in the on state and experiences some degree of recovery when the device is in the off state.

However, although a typical device may experience a balanced 50% on, 50% off stress, some devices may experience nearly 100% on, 0% off stress. Even the 50/50 stress situation produces de vice degradations that are appreciable and results in measurable circuit performance degradation, such that circuits run slower or require higher voltages in order to maintain the same performance.

U.S. Patent Application Publication US 200310042926 A1 published Mar. 6, 2003 discloses a method of testing integrated circuits for the effect of NBTI degradation. A static DC stress voltage is applied to the voltage supply input of the circuit. This circuit is held at this voltage for a given stress period. The application of the DC voltage is equivalent to applying a negative gate bias, and isolates the effects of NBTI degradation from CHC (channel hot carrier) degradation or other degradation that occurs when the circuit has a clocked input.

A need exists for an effective mechanism to accurately detect degradation of a PFET device in either kerf structures, test chips, or product chips such that appropriate measures can be taken to avoid system problems or diagnose the magnitude of degradation.

SUMMARY OF THE INVENTION

A principal object of the present invention is to provide a method and testing circuit for tracking transistor stress degradation. Other important objects of the present invention are to provide such method and testing circuit for tracking transistor stress degradation substantially without negative effect and that overcome many of the disadvantages of prior art arrangements.

In brief, a method and testing circuit are provided for tracking transistor stress degradation. A first array of P-channel field effect transistors (PFETs) is connected in parallel. The first array of PFETs is stressed by applying a low gate input and a high source and a high drain to the PFETs during a stress period. The first array of PFETs is tested by operating the PFETs in a saturated region during a test period. A reference array of PFETs is not stressed during the stress period. The reference array of PFETs is activated for testing to compare a saturated drain current performance with the first array of PFETs during the test period.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
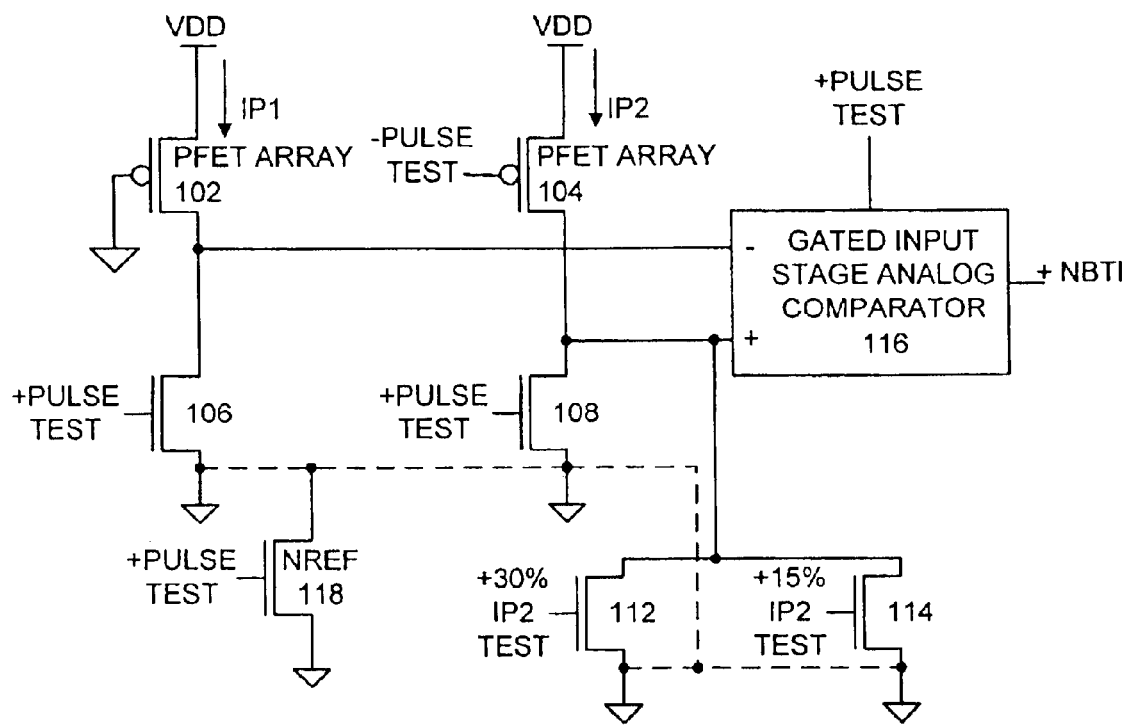
FIG. 1 is a schematic diagram illustrating an exemplary negative bias temperature instability (NBTI) detector circuit in accordance with the preferred embodiment.
Figure 2:
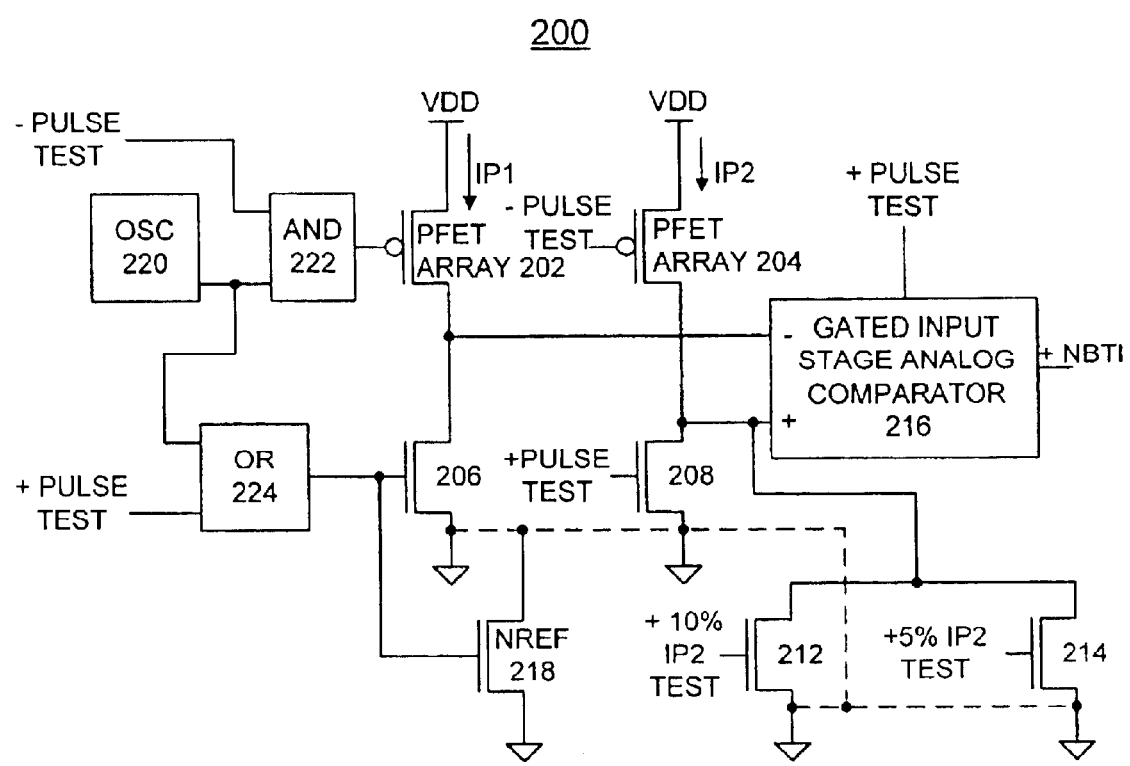
FIG. 2 is a schematic diagram illustrating another negative bias temperature instability (NBTI) detector circuit in accordance with the preferred embodiment.

In accordance with features of the preferred embodiment, a method and exemplary test circuits of FIGS. 1 and 2 are provided to accurately detect the actual degradation of a PFET device in either kerf structure, test chips, or product chips such that appropriate measures can be taken to avoid system problems or diagnose the magnitude of degradation. The test circuits of the preferred embodiment can track chip specific technology performance degradation that will provide feedback for technology and circuit tuning.

In accordance with features of the preferred embodiment, test circuits of FIGS. 1 and 2 are provided to stress an array of PFET devices all connected in parallel and tested in the saturated region, and then compared to the saturated drain current performance of a substantially identical array of PFET devices that sees no stress. The no stress array of PFET devices are given a deterministic amount of additional load current which is either hard or soft set to account for the stressed array anticipated loss of drain current. If the loss is less than allowed, the compare generates a pass result that allows continued operation with no action. If the loss is greater than accounted for, then the compare generates a fall result and the tester or system takes an appropriate action.

The nature of the test circuits of FIGS. 1 and 2 of the preferred embodiment and predetermined test values are such that preventative actions may be taken to prevent system failure. Also, the test circuits of FIGS. 1 and 2 of the preferred embodiment can provide invaluable feedback on a specific technologies performance allowing for process improvements to further reduce NBTI, or other stress effects or to appropriately compensate for the NBTI or other stress effects.

Referring now to the drawings, in FIG. 1 there is shown an exemplary negative bias temperature instability (NBTI) detector circuit generally designated by the reference character 100 in accordance with the preferred embodiment. NBTI detector circuit 100 includes a PFET array designated by 102 that is the target array intended to be stressed. The array of PFET devices 102 is used to detect an average shift in the transistor drain current performance as result of burn-in stress, life stress, or both burn-in and life stress. NBTI detector circuit 100 includes a reference PFET array 104 that is substantially identical in all aspects to PFET array 102, except the reference PFET array 104 is only turned on intermittently for test periods and is used to compare against the stressed PFET array 102, each operating in the saturated region.

Ground potential is applied to the gate of PFET array 102. As a result, PFET array 102 is on all the time and for the sake of NBTI represents the maximum amount of stress that a device will experience. A gate input-PULSE TEST is applied to the reference PFET array 104. As a result, the reference PFET array 104 is turned on only during test periods.

During test periods for comparing transistor performance of the stressed PFET array 102 and the reference PFET array 104, current to the PFET array 102, indicated by an arrow IP1, is provided by a current source N-channel FET (NFET) device 106 having a gate input +PULSE TEST. Current source NFET device 106 may be comprised of multiple N-channel NFET devices whose total width is W, for example, 10 identical fingers, 20 identical fingers, 50 identical fingers, and the like. A current source NFET device 108 having a gate input +PULSE TEST provides load current, indicated by an arrow IP2 for the reference PFET array 104. NFET device 108 similarly has a total width W and is substantially identical in every respect to NFET device 106. A pair of additional reference current source NFET devices 112 and 114 is connected in parallel with NFET 108. Each of the pair of additional reference current source NFET devices 112 and 114 is selectively enabled during the test period.

In addition to current source NFET 108, the NFET devices 112 and 114 having a respective gate input +30% IP2 TEST, +15% IP2 TEST, also can be turned on when a compare is being performed during a test period to identify predefined levels of degradation in PFET array 102. The respective width of the NFET devices 112 and 114 is, for example, is a selected percentage of the width of the substantially identical current source NFET devices 106, 108, such as 0.3 W and 0.15 W. One or the other of NFET devices 112 or 114 is turned on to look for degradations of 30% or 15%, respectively. The respective widths of the NFET devices 112 and 114 are set to check specifically for selected degradation limits on PFET array 102 that is stressed 100% of the time.

More granularity, for example, using programmable widths of the NFET devices 112 and 114 with the appropriate gate control can be provided to check for any desired amount of shift, even to the extent of determining the exact shift at any given moment in time, for example, limited only by the step size of the additional loading structure. For example, a step size of 1% can be achieved by implementing NFET devices 112 and 114 with fingers having widths that are a selected fractional value of W, such as 0.01×, 0.02×, 0.04×, 0.08× of W and turning on one or multiple fingers to get test values in 1% increments over the entire range from 0 to 45%.

The specific values of 15% and 30% for respective widths of the NFET devices 114 and 112 were chosen to represent possible or example absolute limits that could be tolerated by design and test that one might expect to see at the end of burn-in and at the end of life stress, respectively.

A gated input stage analog comparator 116 receiving the gated input +PULSE TEST has a negative input connected to the drain connections of PFET array 102 and NFET 106 for comparison with a positive input connected to the drain connections of the reference PFET array 104 and NFET devices 108, 112, and 114.

When PFET array 102 is tested and remains under a particular selected limit, a pass compare output of the comparator 116 is produced. PFET array 102 having degradation going over a particular selected limit, set by the activation of one, or both, of the NFET devices 114 and 112, produces a fail compare output of the comparator 116 that allows the system to take appropriate preventative action.

Such appropriate preventative actions may include causing the system to raise the voltage supply rail VDD, lower frequency, lower temperature by throttling system performance, increase fan speed to lower temperature, phone home to indicate preventative maintenance should be performed, and other such actions. These actions would be desirable as the stress limits are likely to be set by the amount of margin anticipated by the technology and the test limits used during the manufacture and post-stress testing of the components.

It should be understood that the NBTI detector circuit 100 of the preferred embodiment advantageously is used for tracking incremental transistor stress degradation. For example, test sites might be more apt to adopt fine granularity approaches to looking for how much degradation has occurred after operating a device for a specific period of stress. In this case, a test process can include identifying a small amount of degradation that results in a fail compare output of the comparator 116 and increasing by the minimum step size of NFET devices 112, 114 until the fail is no longer indicated. This would allow the NBTI detector circuit 100 to report, within the limits of the step size, how much degradation has occurred up to that point in time; such as, failed at 6% stress but passed at 7% stress indicating the degradation of PFET array 102 is somewhere between those two values.

A reference NFET NREF 118 having a gate input +PULSE TEST optionally is used to provide a level shift and is coupled between. NFETs 106, 108, 112, 114 and ground potential. The optional reference NFET NREF 118 has a width, for example, of approximately 2 W. The optional reference NFET NREF 118 is shown with a dotted connection to the alternative ground connection of NFETs 106, 108 112, and 114. The optional reference NFET NREF 118 is clocked with +PULSE TEST applied to the gate of NREF 118. The function provided with this reference NFET NREF 118 is that the sources of the NFETs 106, 108 112, and 114 are connected together and are connected through NREF 118 to ground to provide a level shift up in value which may be easier to detect and amplify, consistent with conventional current mirror circuit techniques. Also it may be desirable to adjust the size of NREF 118 so that the + and − inputs of the analog comparator 116 are at approximately VDD/2. Without the optional reference NFET NREF 118 being used, the sources of the NFETs 106, 108 112, and 114 are directly connected to ground for the test period.

Referring now to FIG. 2, there is shown another exemplary NBTI detector circuit generally designated by the reference character 200 in accordance with the preferred embodiment. NBTI detector circuit 200 includes a stressed PFET array 202, a substantially identical unstressed, reference PFET array 204, a pair of current source NFET devices 206, 208; a pair of NFET devices 212 and 214 having a respective gate input +10% IP2 TEST, +5% IP2 TEST, a gated input stage analog comparator 216, a reference NFET NREF 218, as shown.

NBTI detector circuit 200 is essentially identical to NBTI detector circuit 100, in most respects. The major difference in NBTI detector circuit 200 is that the amount of stress on PFET array 202 is reduced to 50%, consistent with a typical transistor in normal use, rather than the 100% stress on PFET array 102 of NBTI detector circuit 100. NBTI detector circuit 200 includes an oscillator 220 that has a 50% duty cycle, an AND gate 222 and an OR gate 224 for such reduced stress operation. As shown, the output of oscillator 220 is applied to a first input of both the AND gate 222 and the OR gate 224, the −PULSE TEST input is applied to the second input of the AND gate 222, and the +PULSE TEST input is applied to the second input of the OR gate 224.

It should be understood that the NBTI detector circuit 200 of the preferred embodiment can be provided with virtually any level of stress desired by using oscillator structures and various combinational logic gates. The relative sizes of NFET devices 212 and 214 are reduced to 0.10 W and 0.05 W consistent with the reduction from the 100% on time of the PFET array 102 to the 50% on time of the PFET array 202. As described above with respect to NBTI detector circuit 100, any expected level can be set using fingered NFET devices 212 and 214 or other variable structure could be added to determine a more exact amount of degradation at any time.

Also the −PULSE TEST and +PULSE TEST signals are used to interrupt the stress process and turn on both the PFET array 202 and the NFET devices 206 so a measurement can be performed. In the case of the reference PFET array 204, there is no need to turn on the gate of NFET devices 208, 212, 214, or other devices that could be provided for finer granularity checking, except when a test is being performed.

NREF 218 also is turned on with the oscillator 220 during stress periods to stimulate the recovery that normal devices go through during the 50% of the time that the gate of PFET array 202 is off. Current source NFET 208 continues to isolate the reference PFET array 204 during the entire stress period.

Stress on the PFET array 102 and PFET array 202 is accomplished in the respective NBTI detector circuits 100, 200 when the gate is low and the source and drain of the PFETs are high.

For NBTI detector circuit 100, this is all of the time except when a test is performed. The test periods do not occur very often as these stress phenomena normally require many thousands of hours of operation in normal conditions and also normally require hours during burn-in conditions.

For NBTI detector circuits 200, the PFET array 202 is stressed 50% of the time with the balanced duty cycle oscillator 220. Typically the stressed operation of NBTI detector circuits 200 is also only interrupted by an infrequent test. Even with a test period that occurs as often as once a minute where the test only lasts a maximum of, or much less than, 100 ns, does not measurably change the stressed percentage of operation.

It should be understood that only activating the current source NFET 206 and the reference current source NFET 208 with +PULSE TEST applied to the gate inputs could provide another embodiment of NBTI detector circuits 200. The intent of this circuit differentiation is to remove the hot-e stress by eliminating any appreciable drain to source current due to switching of the −node. There are varying theories about NBTI threshold shift recovery that may or may not be dependent upon this current or the voltage on the drain of PFET array 202. This implementation could be provided or as described above and shown in FIG. 2, or both could be implemented uniquely. Implementing both arrangements could help provide answers to some of the recovery questions.

Figure 3A:
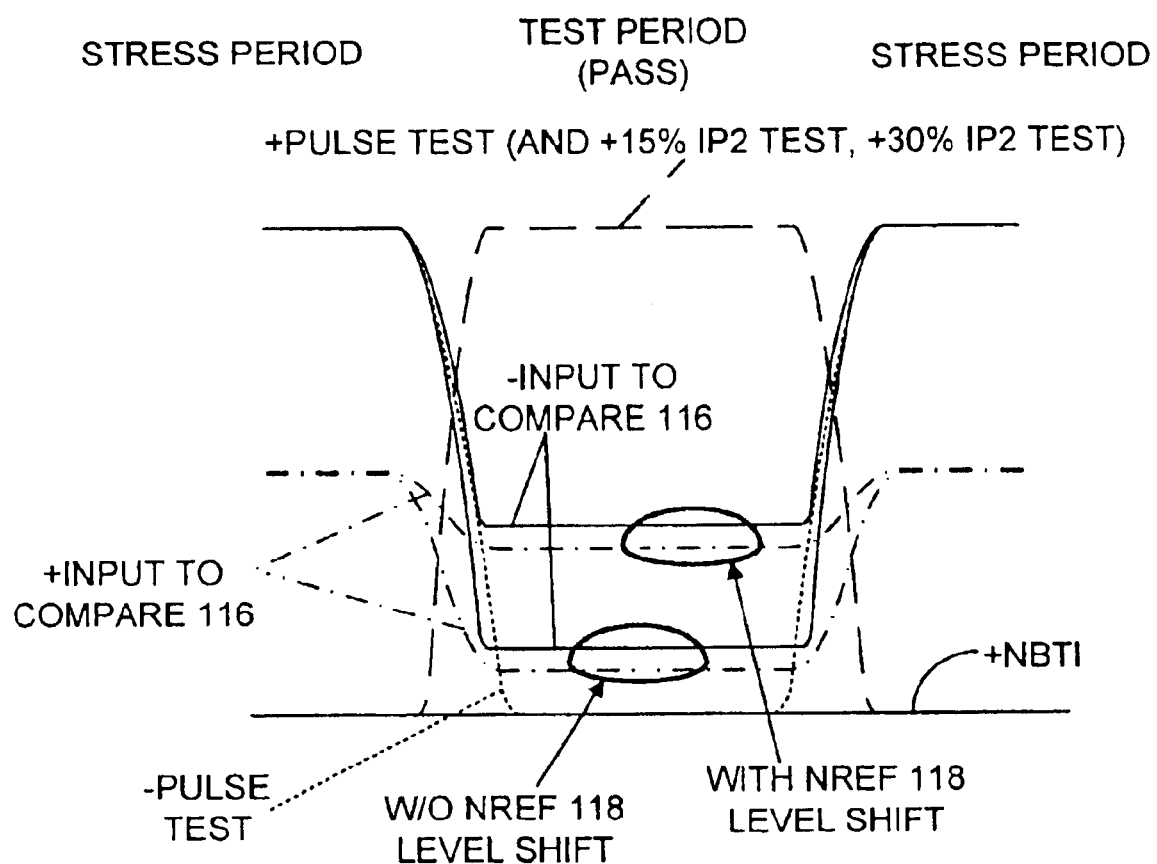
FIGS. 3A and 3B are respective timing diagrams for the NBTI detector circuits of FIG. 1 and FIG. 2 in accordance with the preferred embodiment.
Figure 3B:
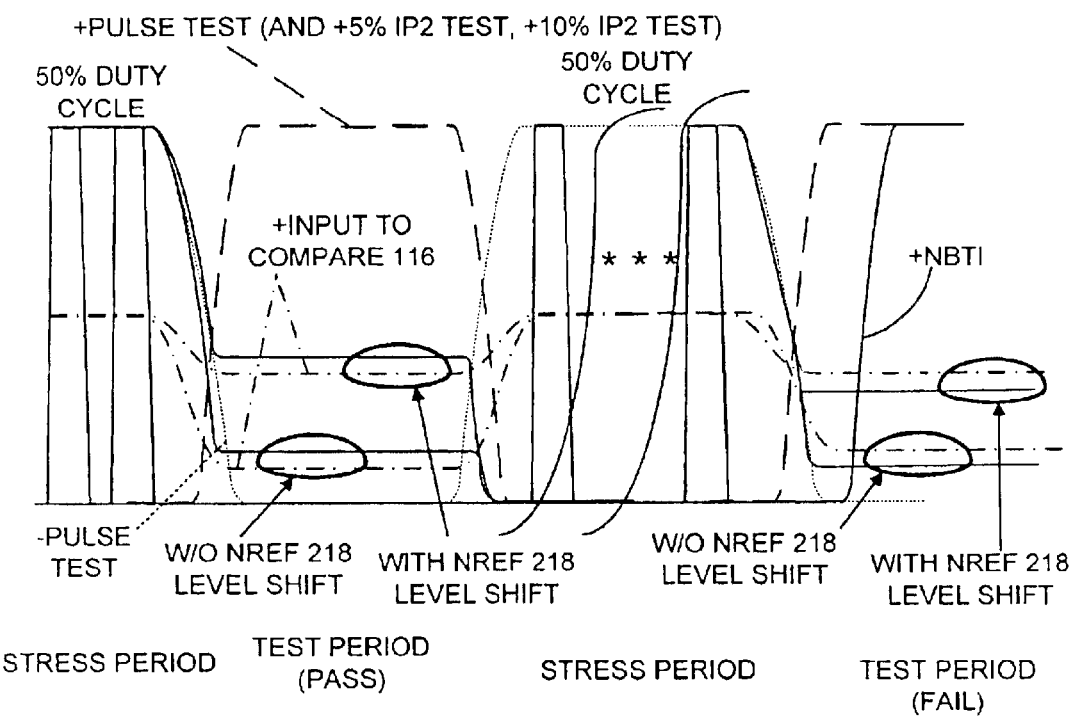

FIGS. 3A and 3B respectively show timing diagrams for the NBTI detector circuits 100 and 200. In FIG. 3A, only one test period with a passing test for the NBTI detector circuit 100 is shown. In operation of the NBTI detector circuit 100 during the test period, +PULSE TEST goes active high and −PULSE TEST goes active low and both the + and −inputs to the gated analog comparator 116 go low. The stressed devices or PFET array 102 drive the −input, and if the PFET array 102 remains higher than the reference devices or PFET array 104 which have the extra load normally driving them to a lower value, the output +NBTI of the gated comparator 116 remains low, as shown in the example of FIG. 3A. Two versions of both the + and −inputs to the gated comparator 116 going low are shown, one with a NREF 110 level shift and the other without a NREF 110 level shift.

In FIG. 3B, for the NBTI detector circuit 200 two tests are shown. In the first test period, a passing test is shown where the stressed −input to the gated comparator 116 remains higher than reference +input to the gated comparator 116. In the second test at the end of the timing diagram, a failing test is shown where the stressed −input to the gated comparator 116 goes lower than the reference input. The +NBTI signal output of the gated comparator 116 goes active to indicate a failing test. The +NBTI signal may reset itself at the end of the test, but the results would normally be captured and saved in a latch (not shown).

It also may be advantageous to measure the exact amount of transistor degradation that occurs after an initial burn-in period of operation with both NBTI detector circuits 100, 200. This can be accomplished by allowing the reference PFET array 104, or the reference PFET array 204, to be left in the on state exactly consistent with the stressed PFET array 102, or the stressed PFET array 202, during burn-in. Then, after the burn-in period is completed, the reference PFET array 104, or the reference PFET array 204, would be left off except during test periods when compares are being performed.

In order to accomplish this, simple changes would be made to both NBTI detector circuits 100, 200. For example, a negative active signal indicating burn-in would be logically ANDed with the −PULSE TEST signal for the gate input of the reference PFET array 104 of the NBTI detector circuit 100 that would remain high for all post burn-in operation. No changes would be made to current source NFET 108, or NFET devices 112, 114.

In the NBTI detector circuit 200, the gate to the reference PFET array 204 would be driven by the logical OR of the gate signal of stressed PFET array 202 and a negative active burn-in signal which in turn is ANDed with PULSE TEST. The current source NFET 208 would be driven by the AND of the gate signal of current source NFET 206 with a positive active burn-in signal which in turn is ORed with +PULSE TEST. NFET devices 212, 214 would only be turned on when a compare is being performed as shown in FIG. 2. With such modifications to the NBTI detector circuits 100, 200, differences would be tracked after burn-in is completed, for giving a more accurate view of post burn-in degradation.

While the present invention has been described with reference to the details of the embodiments of the invention shown in the drawing, these details are not intended to limit the scope of the invention as claimed in the appended claims.

What is claimed is:

1. A testing circuit for tracking transistor stress degradation comprising:
   a first array of P-channel field effect transistors (PFETs) connected in parallel; said first array of PFETs being stressed by applying a low gate input and a high source and a high drain for the PFETs during a stress period; and said first array of PFETs being tested by operating the PFETs in a saturated region during a test period; and
   a reference array of PFETs not being stressed during the stress period and said reference array of PFETs being activated for testing to compare a saturated drain current performance with said first array of PFETs during the test period.

2. A testing circuit as recited in claim 1 includes a first current source N-channel FET (NFET) device coupled to said first array of PFETs; and a test signal input applied to a gate of said first current source NFET device to activate said current source NFET device during the test period.

3. A testing circuit as recited in claim 2 includes a second current source N-channel FET (NFET) device coupled to said reference array of PFETs; and said test signal input applied to a gate of said second current source NFET device to activate said current source NFET device for testing; said first and said second NFET devices being substantially identical devices.

4. A testing circuit as recited in claim 3 includes at least one additional NFET device connected in parallel with said second current source NFET device coupled to said reference array of PFETs; said at least one additional NFET device for supplying a predetermined amount of additional load current to reference array of PFETs.

5. A testing circuit as recited in claim 4 wherein said at least one additional NFET device having a set width equal to a selected percent of a width of said substantially identical first and said second NFET devices; said set width of said at least one additional NFET device selectively provided to identify a predefined level of degradation of said first array of PFETs.

6. A testing circuit as recited in claim 4 includes a reference NFET device coupled between a respective source of each of said first and said second current source NFET devices and said at least one additional NFET device and ground for level shifting.

7. A testing circuit as recited in claim 4 includes a gated input stage comparator coupled to said first array of PFETs and said reference array of PFETs and receiving said test signal input to activate said gated input stage comparator during the test period.

8. A testing circuit as recited in claim 7 wherein said gated input stage comparator has a first input connected to drain connections of said first array of PFETs and said first current source NFET device for comparison with a second input connected to the drain connections said reference array of PFETs and said second current source NFET device and said at least one additional NFET device.

9. A testing circuit as recited in claim 1 wherein said first array of PFETs is stressed by applying a continuous low gate input to the PFETs during the stress period.

10. A testing circuit as recited in claim 1 wherein said first array of PFETs is stressed by applying a dynamic low gate input to the PFETs having a selected duty cycle during the stress period.

11. A testing circuit as recited in claim 10 wherein said dynamic low gate input to the PFETs having a selected duty cycle during the stress period is provided by an oscillator and combinational logic.

12. A method for tracking transistor stress degradation comprising the steps of:

providing a first array of P-channel field effect transistors (PFETs) connected in parallel;

applying a low gate input and a high source and a high drain for the PFETs to stress said first array of PFETs during a stress period;

operating the PFETs in a saturated region to test said first array of PFETs during a test period;

providing a reference array of PFETs not being stressed during the stress period; and activating said reference array of PFETs to compare a saturated drain current performance with said first array of PFETs during the test period.

13. A method for tracking transistor stress degradation as recited in claim 12 wherein the step of operating the PFETs in a saturated region to test said first array of PFETs during a test period includes the steps of coupling a first current source N-channel FET (NFET) device to said first array of PFETs; and applying a test signal input to a gate of said first current source NFET device to activate said current source NFET device during the test period.

14. A method for tracking transistor stress degradation as recited in claim 13 wherein the step of activating said reference array of PFETs to compare a saturated drain current performance with said first array of PFETs during the test period includes the steps of coupling a second current source NFET device to said reference array of PFETs; and applying said test signal input to a gate of said second current source NFET device to activate said current source NFET device during the test period.

15. A method for tracking transistor stress degradation as recited in claim 14 includes the steps of coupling at least one additional NFET device to said reference array of PFETs for supplying a predetermined amount of additional load current to reference array of PFETs during the test period.

16. A method for tracking transistor stress degradation as recited in claim 15 includes the steps of coupling a gated input stage comparator coupled to said first array of PFETs and said reference array of PFETs; and applying said test signal to activate said gated input stage comparator during the test period.

17. A method for tracking transistor stress degradation as recited in claim 12 wherein the step of applying a low gate input and a high source and a high drain for the PFETs to stress said first array of PFETs during a stress period includes the steps of applying a continuous low gate input to the PFETs to stress said first array of PFETs during the stress period.

18. A method for tracking transistor stress degradation as recited in claim 12 wherein the step of applying a low gate input and a high source and a high drain for the PFETs to stress said first array of PFETs during a stress period includes the steps of applying a dynamic low gate input to the PFETs having a selected duty cycle to stress said first array of PFETs during the stress period.

* * * * *